(12) United States Patent
Dosho

(10) Patent No.: US 8,674,864 B2
(45) Date of Patent: Mar. 18, 2014

(54) INTEGRATOR AND OVERSAMPLING A/D CONVERTER HAVING THE SAME

(75) Inventor: Shiro Dosho, Osaka (JP)

(73) Assignee: Panasonic Corporation, Osaka (JP)

( * ) Notice: Subject to any disclaimer, the term of this patent is extended or adjusted under 35 U.S.C. 154(b) by 208 days.

(21) Appl. No.: 13/410,964

(22) Filed: Mar. 2, 2012

(65) Prior Publication Data

US 2012/0161990 A1    Jun. 28, 2012

Related U.S. Application Data

(63) Continuation of application No. PCT/JP2010/004391, filed on Jul. 5, 2010.

(30) Foreign Application Priority Data

Sep. 29, 2009    (JP) .................................. 2009-225143

(51) Int. Cl.
*H03M 3/00*    (2006.01)
(52) U.S. Cl.
USPC .......................................... 341/143; 341/155
(58) Field of Classification Search
USPC ................... 341/143, 155, 156, 158, 172, 110
See application file for complete search history.

(56) References Cited

U.S. PATENT DOCUMENTS

| | | | |
|---|---|---|---|
| 5,392,043 | A | 2/1995 | Ribner |
| 6,100,827 | A | 8/2000 | Boesch et al. |
| 6,137,826 | A | 10/2000 | Boesch |
| 7,289,054 | B1 | 10/2007 | Watanabe |
| 2002/0131389 | A1 | 9/2002 | Boesch et al. |
| 2007/0236375 | A1 | 10/2007 | Andre |
| 2011/0050476 | A1 | 3/2011 | Dosho et al. |
| 2011/0133964 | A1 | 6/2011 | Dosho et al. |
| 2011/0169676 | A1* | 7/2011 | Iriguchi ........................ 341/143 |
| 2011/0169677 | A1 | 7/2011 | Dosho et al. |

FOREIGN PATENT DOCUMENTS

| | | |
|---|---|---|
| CN | 1286834 A | 3/2001 |
| JP | 07-231258 | 8/1995 |

OTHER PUBLICATIONS

International Search Report issued in International Patent Application No. PCT/JP2010/004391 dated Aug. 10, 2010.
R. Schreier et al., "Delta-Sigma Modulators Employing Continuous-Time Circuitry," IEEE Transactions on Circuits and Systems—I: Fundamental Theory and Applications, vol. 43, No. 4, Apr. 1996.
X. Chen et al., "A 18mW CT ΔΣ Modulator with 25 MHz Bandwidth for Next Generation Wireless Applications," IEEE 2007 Custom Integrated Circuits Conference (CICC).
Chinese Search Report issued in corresponding Chinese Application No. 2010800390572, dated Nov. 8, 2013.

* cited by examiner

*Primary Examiner* — Joseph Lauture
(74) *Attorney, Agent, or Firm* — McDermott Will & Emery LLP

(57) ABSTRACT

A high order integrator is configured using an operational amplifier, a first filter connected between an input terminal of the integrator and an inverted input terminal of the operational amplifier, and a second filter connected between the inverted input terminal and output terminal of the operational amplifier. The first filter includes n serially-connected first resistance elements, n−1 first capacitance elements each connected between each interconnecting node of the first resistance elements and the ground, and n−1 second resistance elements each connected between each interconnecting node of the first resistance elements and the ground. The second filter includes n serially-connected second capacitance elements, n−1 third resistance elements each connected between each interconnecting node of the second capacitance elements and the ground, and n−1 third capacitance elements each connected between each interconnecting node of the second capacitance elements and the ground.

9 Claims, 8 Drawing Sheets

INTEGRATOR AND OVERSAMPLING A/D CONVERTER HAVING THE SAME

CROSS-REFERENCE TO RELATED APPLICATION

This is a continuation of PCT International Application PCT/JP2010/004391 filed on Jul. 5, 2010, which claims priority to Japanese Patent Application No. 2009-225143 filed on Sep. 29, 2009. The disclosures of these applications including the specifications, the drawings, and the claims are hereby incorporated by reference in their entirety.

BACKGROUND

The present disclosure relates to an integrator, and more particularly to an integrator suitable for a continuous-time ΔΣ modulator, etc.

Oversampling A/D conversion, which is in widespread use in the front-end of communications equipment, conversion of audio signals, etc., is a circuitry technology essential for the current communications, video, and audio signal processing circuits. One type of oversampling A/D converters is a continuous-time delta-sigma (ΔΣ) A/D converter (CTDS-ADC) having a continuous-time filter (see Richard Schreier and Bo Bang, "Delta-Sigma Modulators Employing Continuous-Time Circuitry," IEEE Transactions on Circuits and Systems—I: Fundamental Theory and Applications, Vol. 43, No. 4, April 1996 and Xuefeng Chen et al., "A 18 mW CT ΔΣ Modulator with 25 MHz Bandwidth for Next Generation Wireless Applications," IEEE 2007 Custom Integrated Circuits Conference, 2007, for example).

In a general CTDS-ADC, an input signal passes through n-cascaded integrators (continuous-time filters) and then is quantized by a quantizer. The digital output of the quantizer is fed back to the n integrators after being converted to an analog current signal by n D/A converters. In the CTDS-ADC, having no switch in its analog circuit portion, the voltage can be reduced. In addition, it is unnecessary to place a prefilter that is normally necessary when a sampling filter is used. Having these features, the CTDS-ADC is suitable for applications to communications systems, and thus recently application development and research have been actively conducted.

The inventor of the present disclosure has found the following on the conventional CTDS-ADC. In order to improve the resolution and SN performance of the CTDS-ADC, the filter order for removal of quantization noise must be increased, and this necessitates the number of operational amplifiers corresponding to the increased filter order. That is, to improve the performance of the CTDS-ADC, a number of operational amplifiers must be used. However, increase in the number of operational amplifiers will increase the circuit scale and the power consumption, causing a bottleneck in improving the performance of system LSIs applied to mobile communications equipment, etc.

SUMMARY

According to the present disclosure, an integrator exhibiting a high-order integral characteristic with one operational amplifier is provided. Moreover, according to the present disclosure, a continuous-time oversampling A/D converter having such an integrator is provided.

The integrator of an example of the present disclosure includes an operational amplifier; a first filter connected between an input terminal of the integrator and an inverted input terminal of the operational amplifier; and a second filter connected between the inverted input terminal and output terminal of the operational amplifier, wherein the first filter includes n (n is an integer equal to or more than 2) serially-connected first resistance elements, n−1 first capacitance elements each connected between each interconnecting node of the first resistance elements and a ground, and n−1 second resistance elements each connected between each interconnecting node of the first resistance elements and the ground, and the second filter includes n serially-connected second capacitance elements, n−1 third resistance elements each connected between each interconnecting node of the second capacitance elements and the ground, and n−1 third capacitance elements each connected between each interconnecting node of the second capacitance elements and the ground.

With the above configuration, by setting the values of the elements appropriately, it is possible to provide a high-order integrator that exhibits the transfer characteristic represented by $1/\alpha s^n$ (where s is a Laplacian and α is a constant determined by the values of the elements) with one operational amplifier.

The integrator may further include a third filter connected between at least one node in the first and second filters and the input terminal of the integrator. The third filter may include at least one resistance element and at least one capacitance element connected in parallel with the at least one resistance element.

With the above configuration, a term of an arbitrary order up to the (n−1)th order can be added to the transfer function of the integrator. Thus, an arbitrary transfer characteristic can be obtained.

Preferably, an overall admittance where elements connected to a first node in the first filter are in parallel connection is equal to an overall admittance where elements connected to a second node in the second filter corresponding to the first node are in parallel connection.

The oversampling A/D converter of the present disclosure includes at least one of the integrator described above. The oversampling A/D converter may include: the integrator described above; a quantizer configured to quantize a signal having passed through the integrator; and a D/A converter configured to convert an output of the quantizer into a current signal and supply the current signal to at least one node in the first and second filters of the integrator.

DETAILED DESCRIPTION

Figure 1:
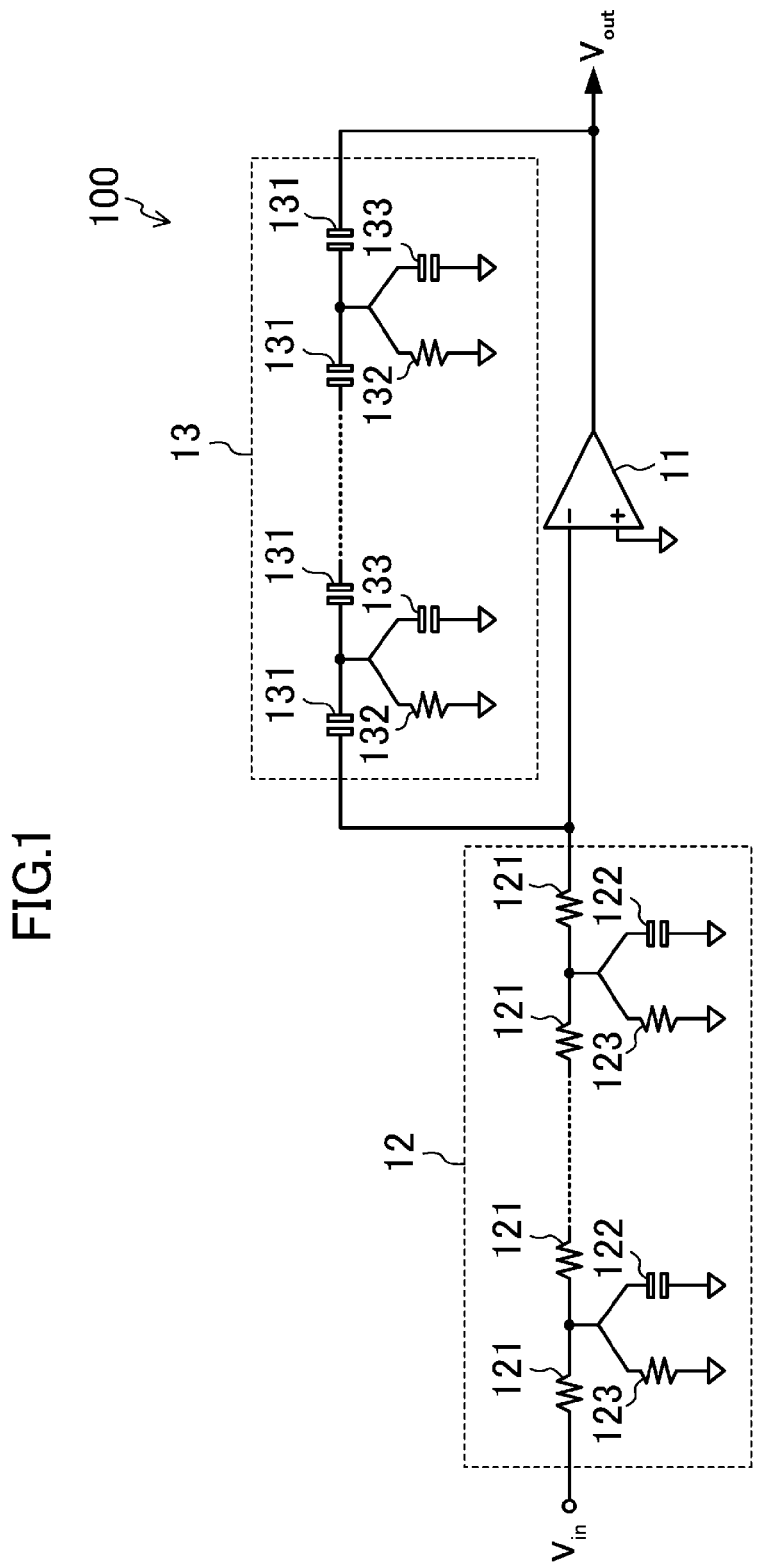
FIG. 1 is a block diagram of a high-order integrator of a first embodiment.

FIG. 1 shows a configuration of a high-order integrator of the first embodiment.

An integrator 100 includes: an operational amplifier 11; a filter 12 connected between the input terminal of the integrator 100 and the inverted input terminal of the operational amplifier 11; and a filter 13 connected between the inverted input terminal and output terminal of the operational amplifier 11. The filter 12 is an n-th order low-pass filter having n serially-connected resistance elements 121, n−1 capacitance elements 122 each connected between each interconnecting node of the resistance elements 121 and the ground, and n−1 resistance elements 123 each connected between each interconnecting node of the resistance elements 121 and the ground. The filter 13 is an n-th order high-pass filter having n serially-connected capacitance elements 131, n−1 resistance elements 132 each connected between each interconnecting node of the capacitance elements 131 and the ground, and n−1 capacitance elements 133 each connected between each interconnecting node of the capacitance elements 131 and the ground.

When the input signal and output signal of the integrator 100 are respectively denoted by $V_{in}$ and $V_{out}$, the transfer function of the integrator 100 is generally expressed by $$\frac{V_{out}}{V_{in}} = -\frac{(\gamma_{n-1}s^{n-1} + \gamma_{n-2}s^{n-2} \ldots + \gamma_1 s + \gamma_0)}{\alpha s^n(\beta_{n-1}s^{n-1} + \beta_{n-2}s^{n-2} \ldots + \beta_1 s + \beta_0)}$$

where α, β, and γ are constants determined by the values of the elements of the filters 12 and 13.

The above transfer function will be $1/\alpha s^n$ if the following equation is satisfied, permitting the integrator 100 to serve as an n-th order integrator. In other words, the element values are determined by solving (n−1)th order simultaneous equations. Since the degree of freedom of the elements constituting the filters 12 and 13 is greater than the degree of freedom of the solutions to the following simultaneous equations, the solutions to the following simultaneous equations are present at any time.

$$\frac{\gamma_{n-1}}{\beta_{n-1}} = \frac{\gamma_{n-2}}{\beta_{n-2}} \ldots = \frac{\gamma_1}{\beta_1} = \frac{\gamma_0}{\beta_0}$$

Figure 2:
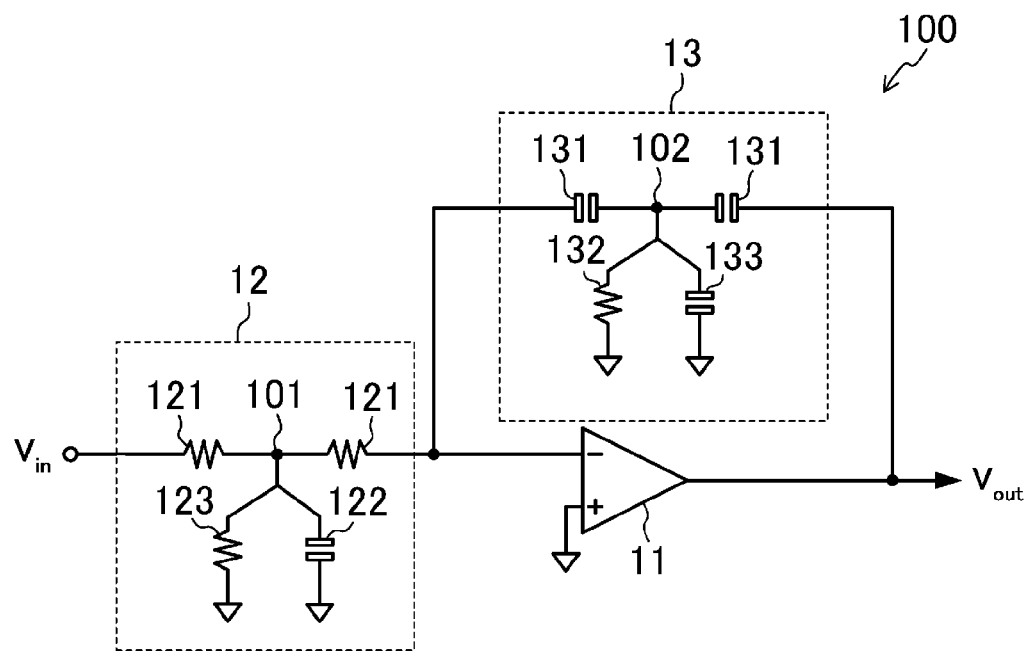
FIG. 2 is a block diagram of a second-order integrator as an example of the integrator of FIG. 1.

FIG. 2 shows an example of the integrator 100 where n=2. In the integrator 100, when the resistance values of the resistance elements 121 connected to the signal input terminal and the inverted input terminal of the operational amplifier 11 are respectively $R_1$ and $R_2$, the capacitance value of the capacitance element 122 is $C_{t1}$, the resistance value of the resistance element 123 is $R_{t1}$, the capacitance values of the capacitance elements 131 connected to the inverted input terminal and output terminal of the operational amplifier 11 are respectively $C_1$ and $C_2$, the resistance value of the resistance element 132 is $R_{t2}$, the capacitance value of the capacitance element 133 is $C_{t2}$, the voltage at a node 101 connecting the resistance elements 121 and 123 and the capacitance element 122 is $V_1$, and the voltage at a node 102 connecting the capacitance elements 131 and 133 and the resistance element 132 is $V_2$, the following nodal equations are satisfied.

$$\begin{cases} \frac{(V_1 - V_{in})}{R_1} + V_1 \cdot \left(\frac{1}{R_{t1}} + s \cdot C_{t1}\right) + \frac{V_1}{R_2} = 0 \\ -\frac{V_1}{R_2} - V_2 \cdot sC_1 = 0 \\ V_2 \cdot sC_1 + V_2 \cdot \left(\frac{1}{R_{t2}} + s \cdot C_{t2}\right) + (V_2 - V_{out}) \cdot sC_2 = 0 \end{cases}$$

Assuming that the overall admittance where the elements connected to the node 101 in the filter 12 are in parallel connection is equal to the overall admittance where the elements connected to the node 102 in the filter 13 are in parallel connection, e.g., $C_{t1} = C_1 + C_2 + C_{t2}$ and $1/R_{t2} = 1/R_1 + 1/R_2 + 1/R_{t1}$, the following transfer function is derived. That is, the integrator 100 serves as a second-order integrator.

$$\frac{V_{out}}{V_{in}} = -\frac{1}{s^2 R_1 R_2 C_1 C_2}$$

Figure 3:
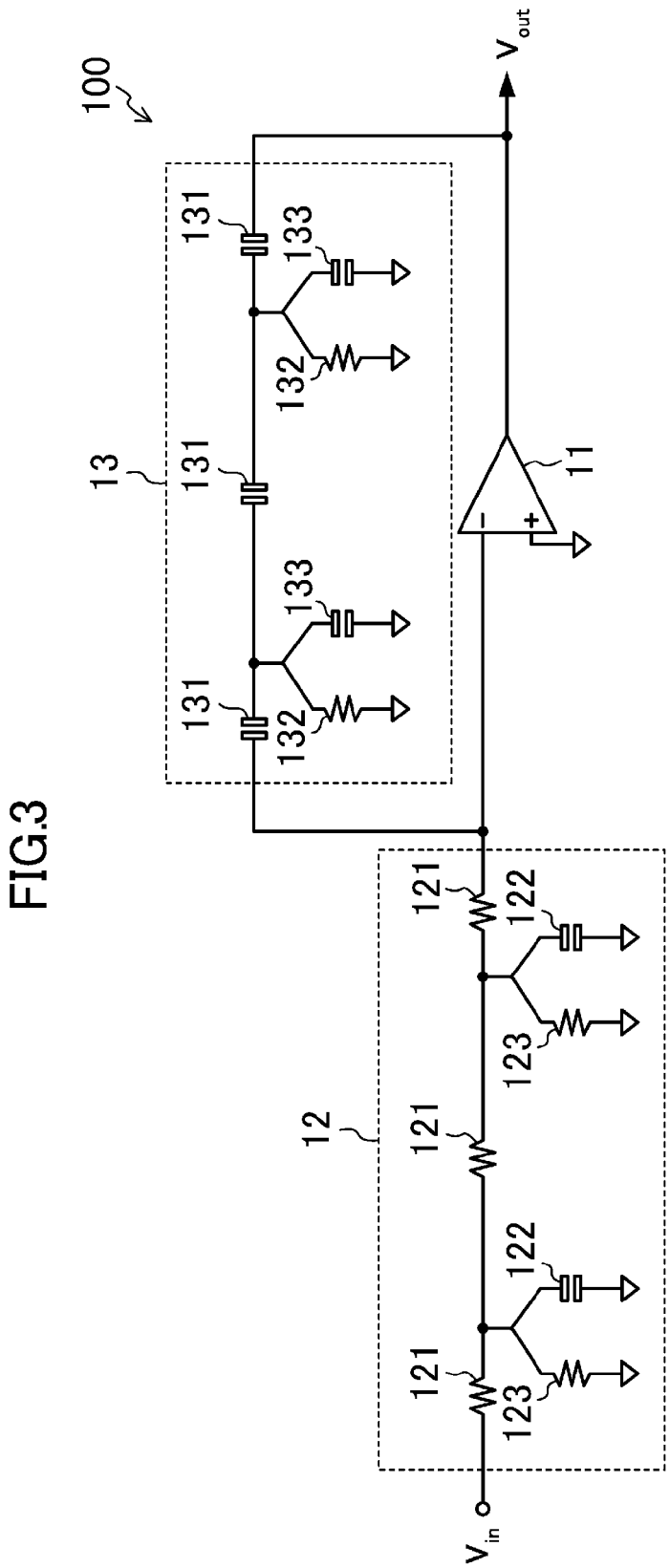
FIG. 3 is a block diagram of a third-order integrator as another example of the integrator of FIG. 1.

FIG. 3 shows an example of the integrator 100 where n=3. When the resistance values of the resistance elements 121 are $R_1, R_2$, and $R_3$ from left to right as viewed from FIG. 3, which also applies in the following values, the capacitance values of the capacitance elements 122 are $C_{t1}$ and $C_{t2}$, the resistance values of the resistance elements 123 are $R_{t1}$ and $R_{t2}$, the capacitance values of the capacitance elements 131 are $C_1$, $C_2$, and $C_3$, the resistance values of the resistance elements 132 are $R_{t3}$ and $R_{t4}$, the capacitance values of the capacitance elements 133 are $C_{t3}$ and $C_{t4}$, the voltages at the nodes connecting the resistance elements 121 and 123 and the capacitance element 122 are $V_1$ and $V_2$, and the voltages at the nodes connecting the capacitance elements 131 and 133 and the resistance element 132 are $V_3$ and $V_4$, the following nodal equations are satisfied.

$$\begin{cases} \frac{(V_1 - V_{in})}{R_1} + V_1 \cdot \left(\frac{1}{R_{t1}} + s \cdot C_{t1}\right) + \frac{(V_1 - V_2)}{R_2} = 0 \\ \frac{(V_2 - V_1)}{R_2} + V_2 \cdot \left(\frac{1}{R_{t2}} + s \cdot C_{t2}\right) + \frac{V_2}{R_3} = 0 \\ -\frac{V_2}{R_3} - V_3 \cdot sC_1 = 0 \\ V_3 \cdot sC_1 + V_3 \cdot \left(\frac{1}{R_{t3}} + s \cdot C_{t3}\right) + (V_3 - V_4) \cdot sC_2 = 0 \\ (V_4 - V_3) \cdot sC_2 + V_4 \cdot \left(\frac{1}{R_{t4}} + s \cdot C_{t4}\right) + (V_4 - V_{out}) \cdot sC_3 = 0 \end{cases}$$

Assuming that the resistance values $R_1, R_2, R_3, R_{t1}, R_{t2}, R_{t3}$, and $R_{t4}$ are all $R_{in}$, the capacitance values $C_1, C_2, C_3, C_{t3}$, and $C_{t4}$ are all $C_f$, and the capacitance values $C_{t1}$ and $C_{t2}$ are both $8C_f$, the following transfer function is derived. That is, the integrator 100 serves as a third-order integrator.

$$\frac{V_{out}}{V_{in}} = -\frac{1}{3s^3 R_{in}^3 C_f^3}$$

Second Embodiment

Figure 4:
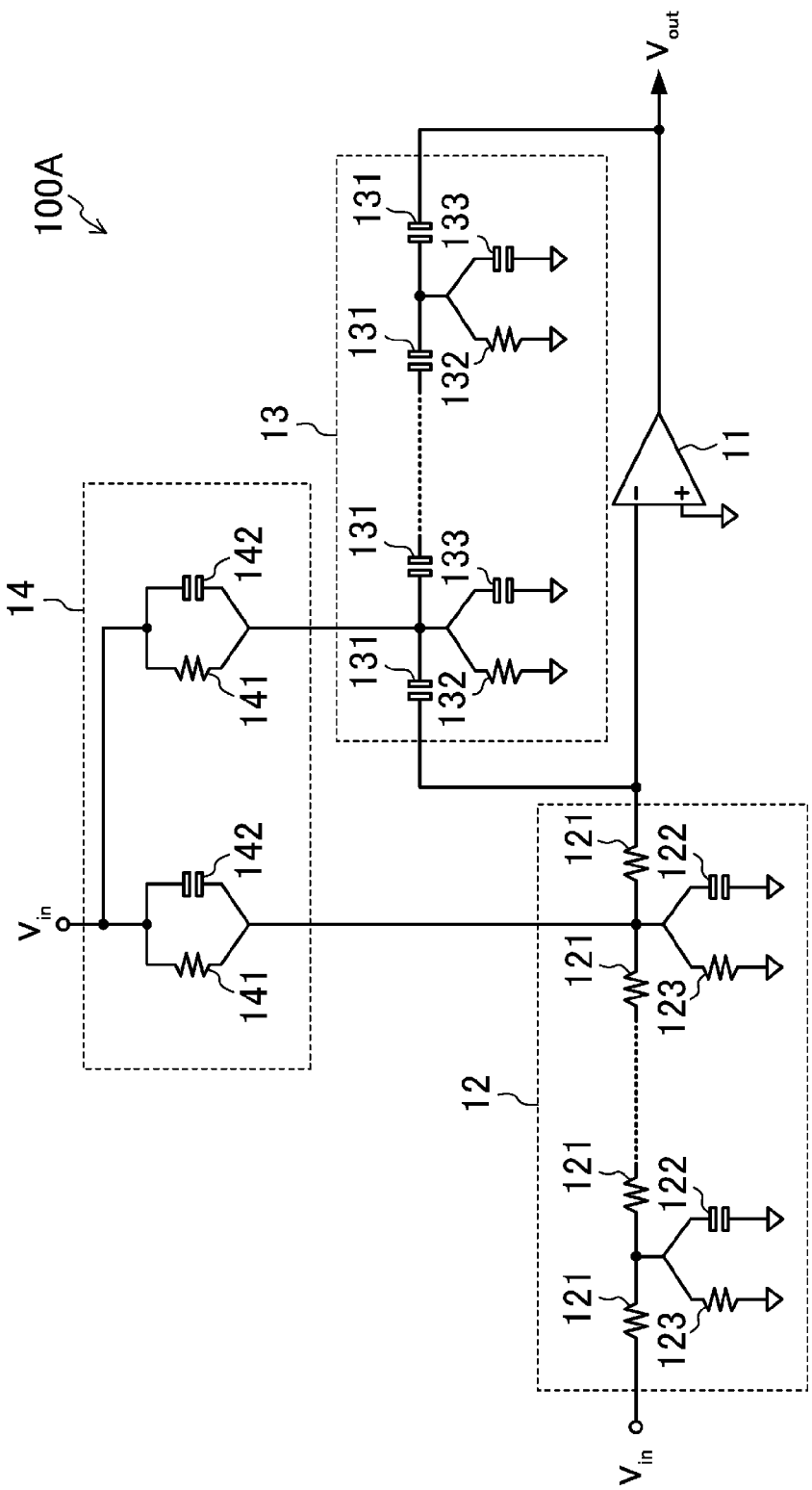
FIG. 4 is a block diagram of a high-order integrator of a second embodiment.

FIG. 4 shows a configuration of a high-order integrator of the second embodiment. An integrator 100A of this embodiment has a filter 14 in addition to the components of the integrator 100 of the first embodiment. A difference from the first embodiment will be described hereinafter.

The filter 14 has at least one resistance element 141 and at least one capacitance element 142 connected in parallel. One of the terminals of each of the elements is connected to the signal input terminal and the other terminal is connected to one of the nodes in the filters 12 and 13. In other words, the input signal Vin is coupled to any given node in the filters 12 and 13 via the filter 14. The filter 14 illustrated in FIG. 4 has two resistance elements 141 and two capacitance elements 142 connected in parallel. The other terminals of one of the pairs of the resistance elements 141 and the capacitance elements 142 are connected to the right-side node in the filter 12 as viewed from FIG. 4, and the other terminals of the other pair of the resistance element 141 and the capacitance element 142 are connected to the left-side node in the filter 13 as viewed from FIG. 4.

An important point in this embodiment is that the impedances of the filters 12 and 13 should not be changed by the addition of the filter 14. For example, when the capacitance value of the capacitance element 122 and the resistance value of the resistance element 123 before the connection of the resistance element 141 and the capacitance element 142 are respectively $C_t$ and $R_t$, the capacitance value of the capacitance element 122 and the resistance value of the resistance element 123 after the connection are respectively $C_t'$ and $R_t'$, the resistance value of the resistance element 141 is $R_t''$, and the capacitance value of the capacitance element 142 is $C_t''$, the values of the elements should be determined to satisfy $C_t = C_t' + C_t''$ and $1/R_t = 1/R_t' + 1/R_t''$. With this determination, it is possible to add a term of an arbitrary order up to the (n−1)th order to the transfer function while maintaining the n-th order integral characteristic of the integrator 100A.

Figure 5:
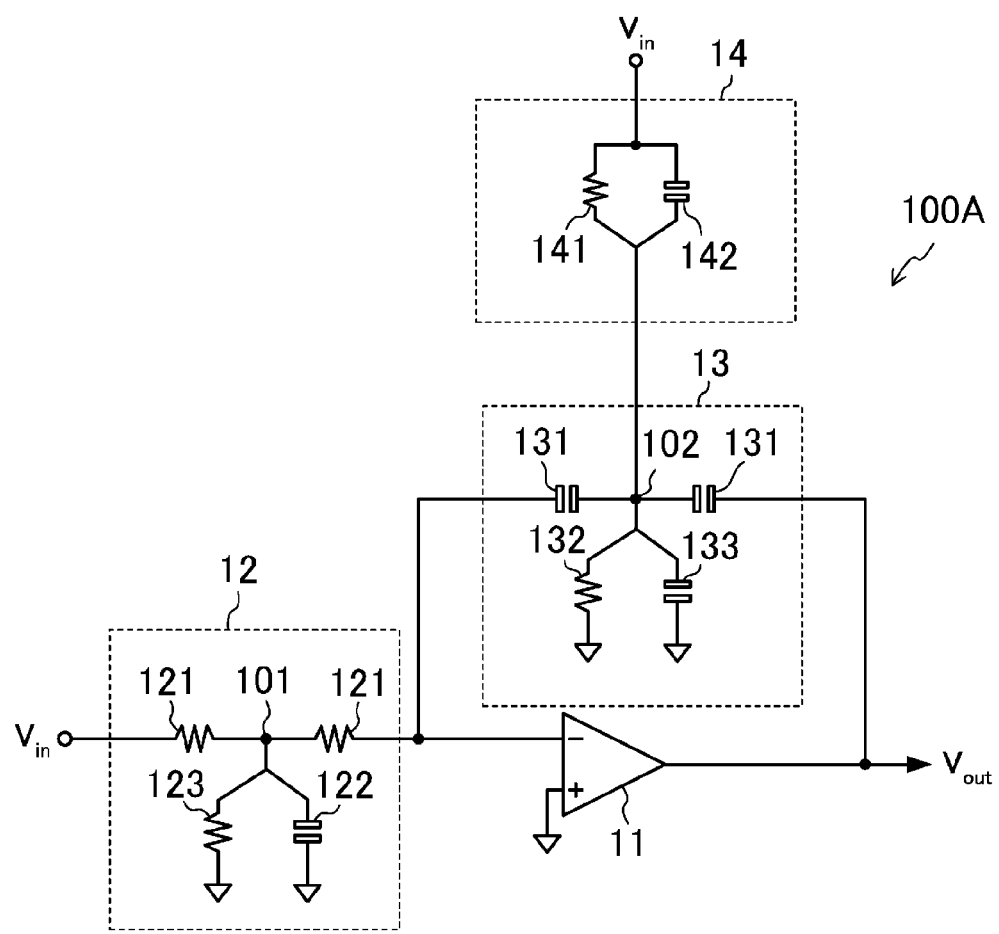
FIG. 5 is a block diagram of a second-order integrator as an example of the integrator of FIG. 4.

FIG. 5 shows an example of the integrator 100A where n=2. Note that the capacitance element 133 in the filter 13 of the integrator 100 of FIG. 2 is omitted in this case due to the addition of the capacitance element 142. In the integrator 100A, when the resistance value of the resistance element 141 is $R_{in}$ and the capacitance value of the capacitance element 142 is $C_{in}$ additionally, the following nodal equations are satisfied.

$$\begin{cases} \frac{V_1 - V_{in}}{R_1} + V_1 \cdot \left(\frac{1}{R_{t1}} + s \cdot C_{t1}\right) + \frac{V_1}{R_2} = 0 \\ -\frac{V_1}{R_2} - V_2 \cdot sC_1 = 0 \\ (V_2 - V_{in}) \cdot \left(\frac{1}{R_{in}} + s \cdot C_{in}\right) + \frac{V_2}{R_{t2}} + V_2 \cdot sC_1 + (V_2 - V_{out}) \cdot sC_2 = 0 \end{cases}$$

Assuming that the overall admittance where the elements connected to the node 101 in the filter 12 are in parallel connection is equal to the overall admittance where the elements connected to the node 102 in the filter 13 are in parallel connection, e.g., $C_{t1} = C_1 + C_2 + C_{in}$ and $1/R_{t1} = 1/R_1 + 1/R_2$, and $R_{t1} = R_{in}$, the following transfer function is derived. That is, an arbitrary second-order transfer function including $s^{-2}$ term, $s^{-1}$ term, and a constant term is implemented.

$$\frac{V_{out}}{V_{in}} = -\frac{C_{in}}{C_2} - \frac{1}{sR_{in}C_2} - \frac{1}{s^2 R_1 R_2 C_1 C_2}$$

Figure 6:
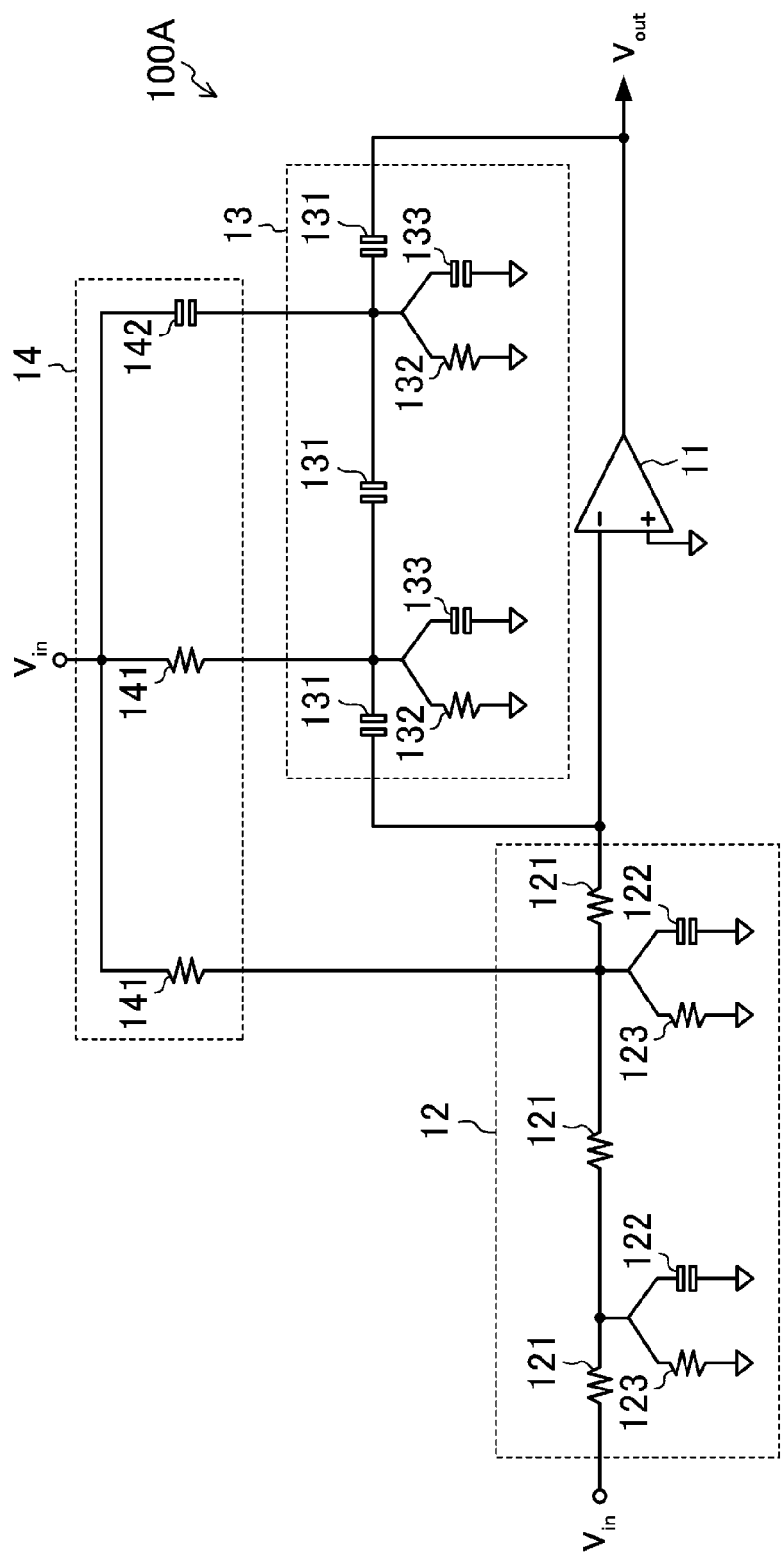
FIG. 6 is a block diagram of a third-order integrator as another example of the integrator of FIG. 4.

FIG. 6 shows an example of the integrator 100A where n=3. In the integrator 100A, when the resistance values of the resistance elements 123 and 141 connected to each other are $R_{t2}'$ and $R_{t2}''$, respectively, the resistance values of the resistance elements 132 and 141 connected to each other are $R_{t3}'$ and $R_{t3}''$, respectively, and the capacitance values of the capacitance elements 133 and 142 connected to each other are $C_{t4}'$ and $C_{t4}''$, respectively, the following nodal equations are satisfied.

$$\begin{cases} \frac{(V_1 - V_{in})}{R_1} + V_1 \cdot \left(\frac{1}{R_{t1}} + s \cdot C_{t1}\right) + \frac{(V_1 - V_2)}{R_2} = 0 \\ \frac{(V_2 - V_{in})}{R_{t2}''} + \frac{(V_2 - V_1)}{R_2} + V_2 \cdot \left(\frac{1}{R_{t2}'} + s \cdot C_{t2}\right) + \frac{V_2}{R_3} = 0 \\ -\frac{V_2}{R_3} - V_3 \cdot s \cdot C_1 = 0 \\ \frac{(V_3 - V_{in})}{R_{t3}''} + V_3 \cdot s \cdot C_1 + V_3 \cdot \left(\frac{1}{R_{t3}'} + s \cdot C_{t3}\right) + (V_3 - V_4) \cdot s \cdot C_2 = 0 \\ (V_4 - V_{in}) \cdot s \cdot C_{t4}'' + (V_4 - V_3) \cdot s \cdot C_2 + \\ V_4 \cdot \left(\frac{1}{R_{t4}} + s \cdot C_{t4}'\right) + (V_4 - V_{out}) \cdot s \cdot C_3 = 0 \end{cases}$$

Assuming that the resistance values $R_1$, $R_2$, $R_3$, $R_{t1}$, $R_{t2}$, $R_{t3}$, and $R_{t4}$ are all $R_{in}$, the capacitance values $C_1$, $C_2$, $C_3$, $C_{t3}$, and $C_{t4}$ are all $C_f$ and the capacitance values $C_{t1}$ and $C_{t2}$ are both $8C_f$, and moreover the conditions of $C_{t4} = C_{t4}' + C_{t4}''$, $1/R_{t2} = 1/R_{t2}' + 1/R_{t2}''$, and $1/R_{t3} = 1/R_{t3}' + 1/R_{t3}''$ are satisfied, the following transfer function is derived. That is, an arbitrary third-order transfer function including $s^{-3}$ term, $s^{-2}$ term, $s^{-1}$ term, and a constant term is implemented.

$$\frac{V_{out}}{V_{in}} = -\frac{C_{t4}''}{C_f} - \frac{3}{C_f R_{t3}'' s} - \left(\frac{1}{R_{t2}''} + \frac{1}{R_{t3}''}\right)\frac{1}{C_f^2 R_{in} s^2} - \left(\frac{1}{R_{in}} + \frac{3}{R_{t2}''}\right)\frac{1}{8 C_f^3 R_{in}^2 s^3}$$

Note that the integrators of the first and second embodiments can be transformed into high-order resonators by providing a resistive path between an interconnecting node of the resistance elements 121, e.g., the node 101 shown in FIGS. 2 and 5, and the output terminal of the operational amplifier 11.

Third Embodiment

Figure 7:
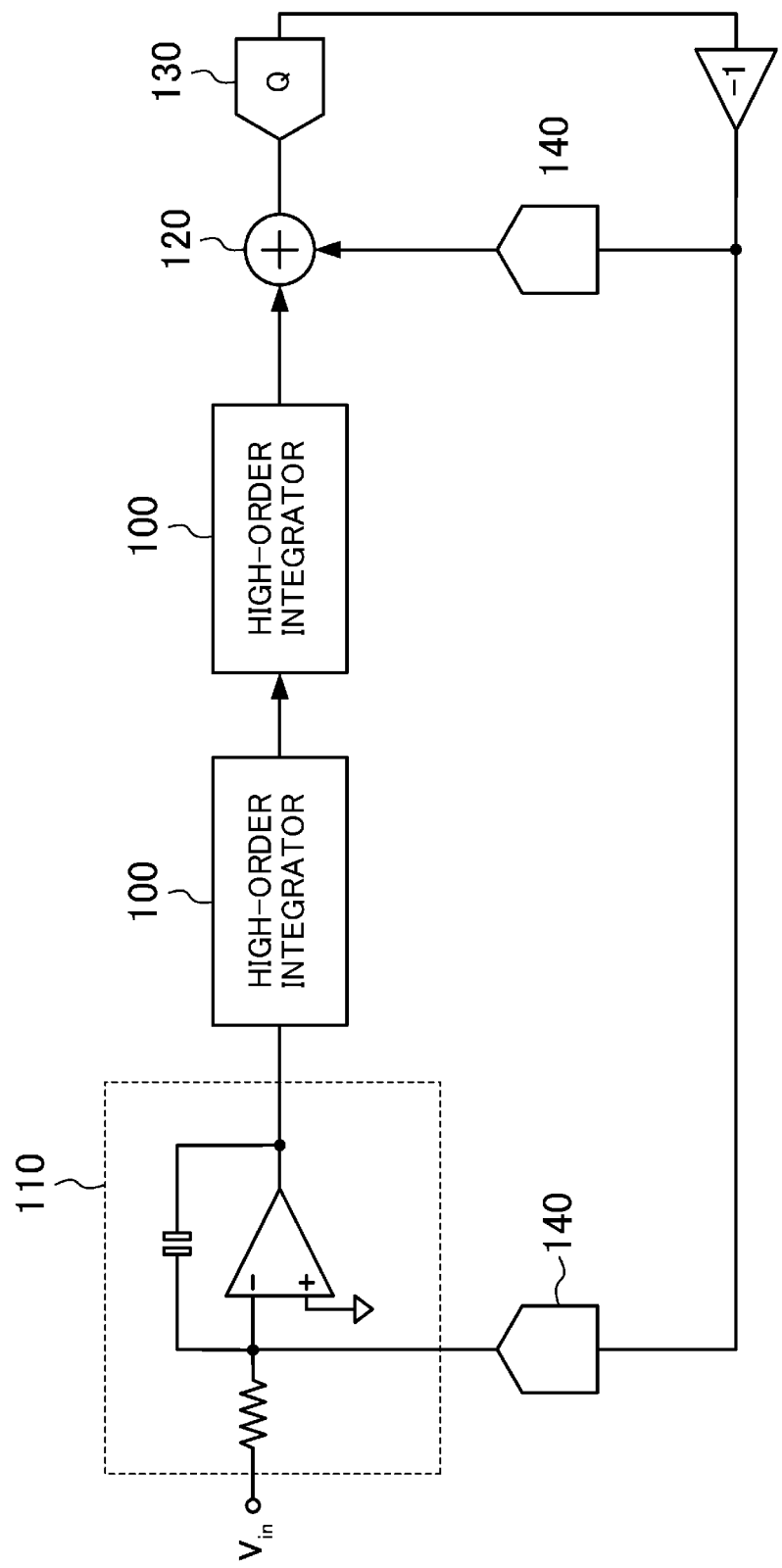
FIG. 7 is a block diagram of an oversampling AID converter of a third embodiment.

FIG. 7 shows a configuration of a CTDS-ADC of the third embodiment. In FIG. 7, the reference character 110 denotes a general first-order integrator, 120 denotes an adder, 130 denotes a quantizer, and 140 denotes D/A converters (voltage-current converters). Each of integrators 100 is the high-order integrator of the first embodiment. When the second-order integrator shown in FIG. 2 is adopted as the integrator 100, for example, the CTDS-ADC of this embodiment exhibits the fifth-order integral characteristic by the cascade connection of the first-order integrator 110 and the two integrators 100.

Fourth Embodiment

Figure 8:
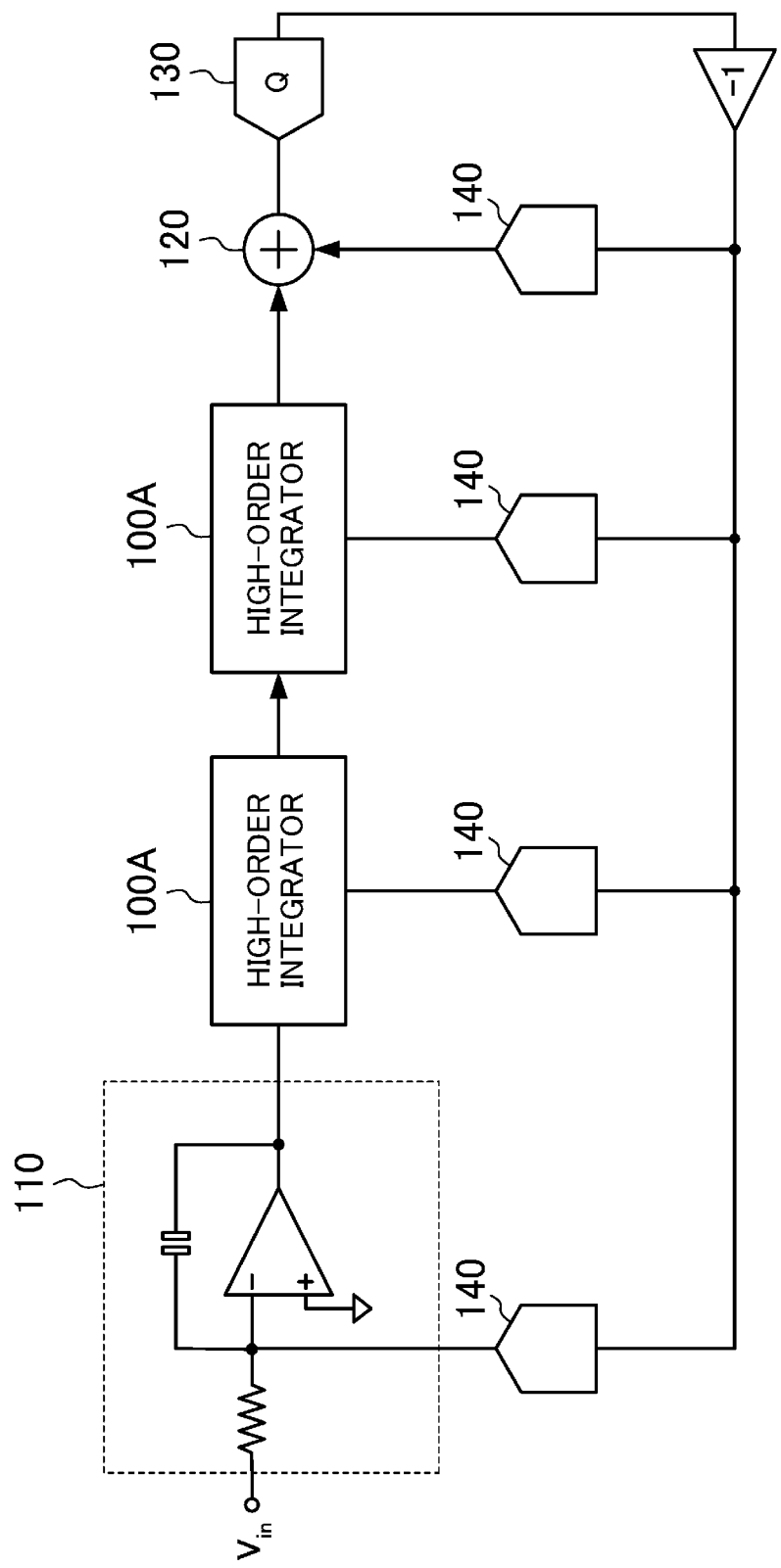
FIG. 8 is a block diagram of an oversampling A/D converter of a fourth embodiment.

FIG. 8 shows a configuration of a CTDS-ADC of the fourth embodiment. The CTDS-ADC of this embodiment has integrators 100A in place of the integrators 100 in the CTDS-ADC of the third embodiment. Each of the integrators 100A is the high-order integrator of the second embodiment. When the second-order integrator shown in FIG. 5 is adopted as the integrator 100A, for example, the output of the quantizer 130 is converted to a current by the D/A converters 140 and fed back to predetermined nodes of the integrators 100A. By the cascade connection of the first-order integrator 110 and the two integrators 100A, the CTDS-ADC of this embodiment exhibits the fifth-order integral characteristic.

What is claimed is:

1. An integrator, comprising:
    an operational amplifier;
    a first filter connected between an input terminal of the integrator and an inverted input terminal of the operational amplifier; and
    a second filter connected between the inverted input terminal and output terminal of the operational amplifier,
    wherein
        the first filter includes
            n (n is an integer equal to or more than 2) serially-connected first resistance elements,
            n−1 first capacitance elements each connected between each interconnecting node of the first resistance elements and a ground, and
            n−1 second resistance elements each connected between each interconnecting node of the first resistance elements and the ground, and
        the second filter includes
            n serially-connected second capacitance elements,
            n−1 third resistance elements each connected between each interconnecting node of the second capacitance elements and the ground, and
            n−1 third capacitance elements each connected between each interconnecting node of the second capacitance elements and the ground.

2. The integrator of claim 1, wherein
    an overall admittance where elements connected to a first node in the first filter are in parallel connection is equal to an overall admittance where elements connected to a second node in the second filter corresponding to the first node are in parallel connection.

3. An oversampling A/D converter comprising the integrator of claim 2.

4. The integrator of claim 1, further comprising:
    a third filter connected between at least one node in the first and second filters and the input terminal of the integrator,
    wherein
        the third filter includes
            at least one resistance element, and
            at least one capacitance element connected in parallel with the at least one resistance element.

5. The integrator of claim 4, wherein
    an overall admittance where elements connected to a first node in the first filter are in parallel connection is equal to an overall admittance where elements connected to a second node in the second filter corresponding to the first node are in parallel connection.

6. An oversampling A/D converter comprising the integrator of claim 5.

7. An oversampling A/D converter comprising the integrator of claim 4.

8. An oversampling A/D converter comprising
    the integrator of claim 1;
    a quantizer configured to quantize a signal having passed through the integrator; and
    a D/A converter configured to convert an output of the quantizer into a current signal and supply the current signal to at least one node in the first and second filters of the integrator.

9. An oversampling A/D converter comprising the integrator of claim 1.

* * * * *